(12) United States Patent
Abe

(10) Patent No.: US 7,408,213 B2
(45) Date of Patent: Aug. 5, 2008

(54) FERROELECTRIC MEMORY DEVICE AND METHOD OF MANUFACTURE OF SAME

(75) Inventor: Kazuhide Abe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 160 days.

(21) Appl. No.: 11/393,830

(22) Filed: Mar. 31, 2006

(65) Prior Publication Data

US 2006/0226457 A1 Oct. 12, 2006

(30) Foreign Application Priority Data

Apr. 12, 2005 (JP) ............................. 2005-114680

(51) Int. Cl.
*H01L 31/062* (2006.01)
(52) U.S. Cl. .............................. 257/295; 257/E27.104; 257/379; 438/3
(58) Field of Classification Search ................. 257/295, 257/E27.104
See application file for complete search history.

(56) References Cited

U.S. PATENT DOCUMENTS

2001/0020708 A1* 9/2001 Kasai ......................... 257/295
2004/0084701 A1* 5/2004 Kanaya et al. ............... 257/295
2005/0101034 A1* 5/2005 Aggarwal et al. ............. 438/3
2007/0134924 A1* 6/2007 Yaegashi ..................... 438/697

FOREIGN PATENT DOCUMENTS

| JP | 2002-043541 | 2/2002 |
|----|-------------|--------|
| JP | 2003-100994 | 4/2003 |
| JP | 2004-023043 | 1/2004 |

* cited by examiner

*Primary Examiner*—Tu-Tu V Ho
(74) *Attorney, Agent, or Firm*—Volentine & Whitt, P.L.L.C.

(57) ABSTRACT

A ferroelectric memory device has a lower insulating film formed on a semiconductor substrate. A ferroelectric capacitor structure is formed on the lower insulating film. The ferroelectric capacitor structure is created by layering in order a lower electrode, ferroelectric layer and upper electrode. The ferroelectric memory device also has an upper insulating film which covers the ferroelectric capacitor structure. A wiring layer is formed over the upper insulating film. An aluminum oxide film of thickness 5 to 50 nm is formed so as to cover the wiring layer and upper insulating film.

8 Claims, 13 Drawing Sheets

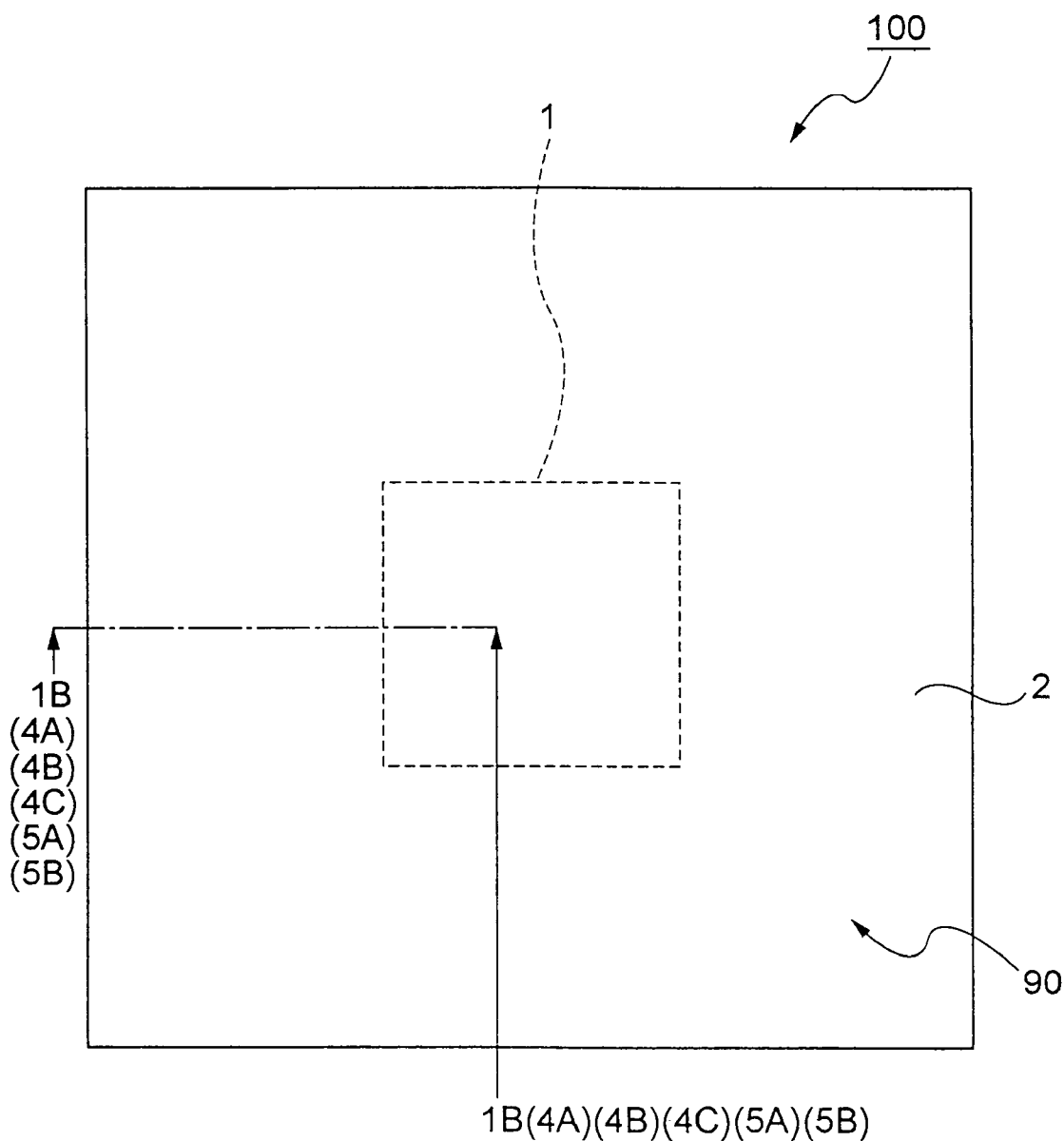

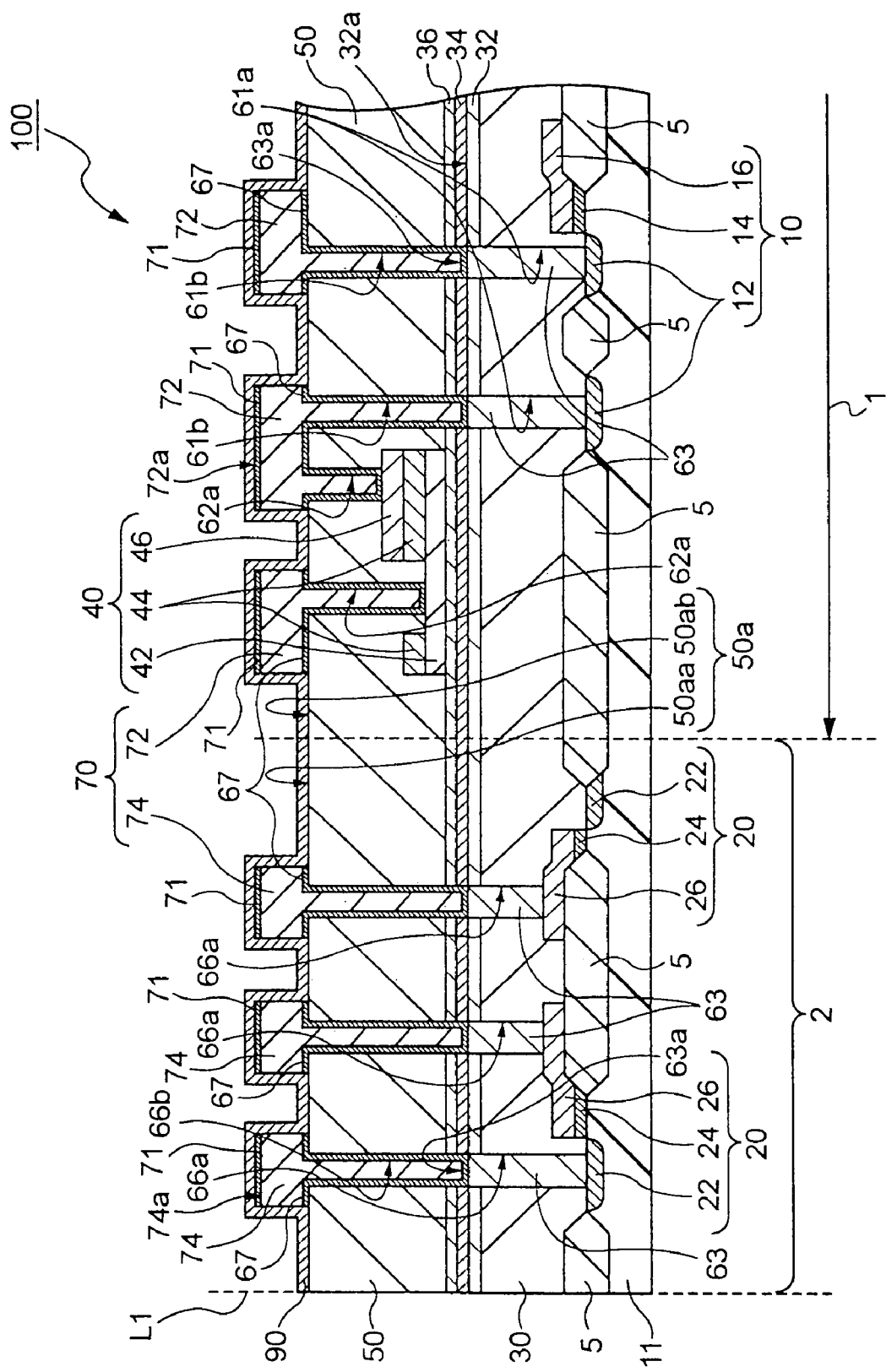

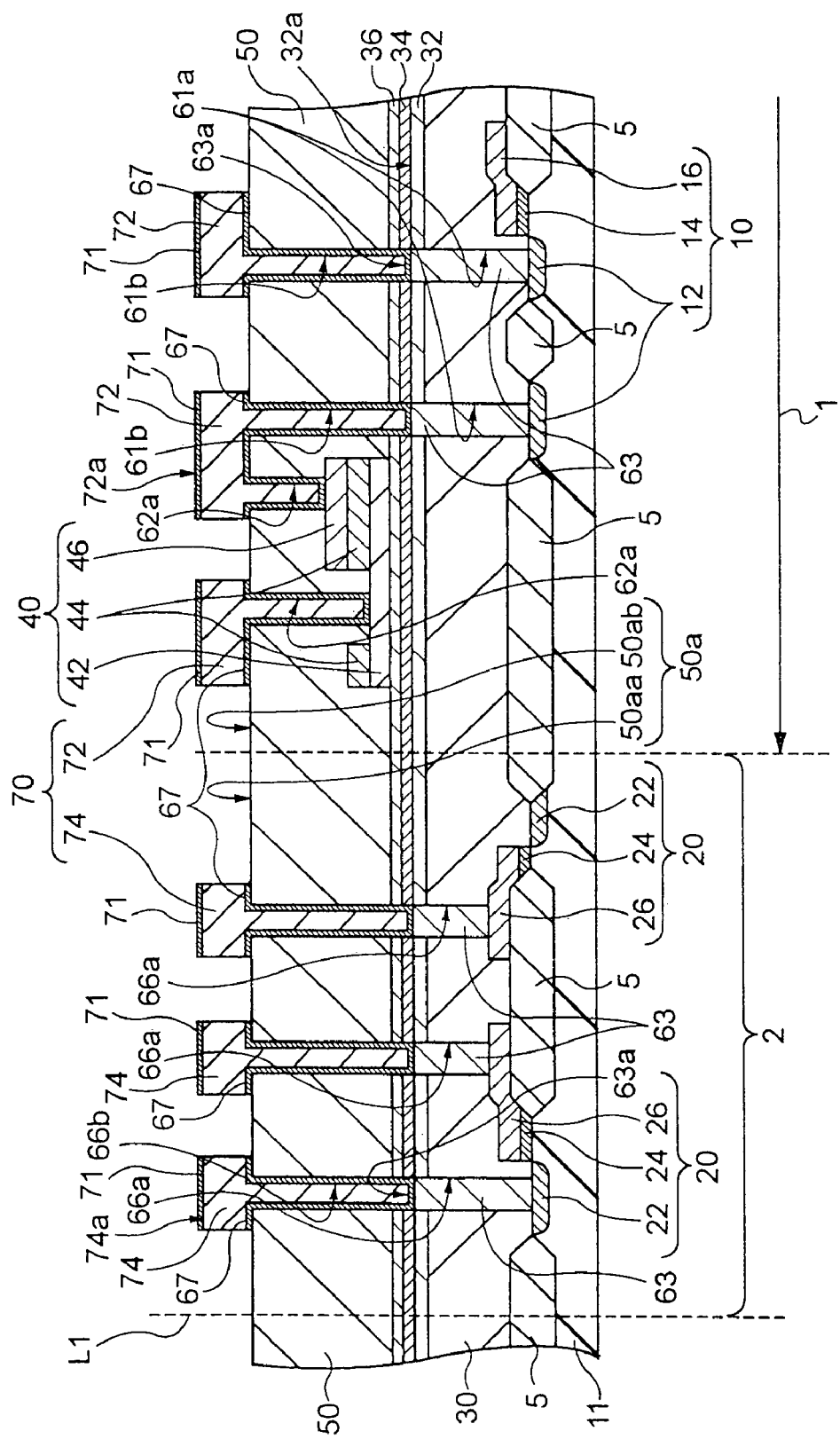

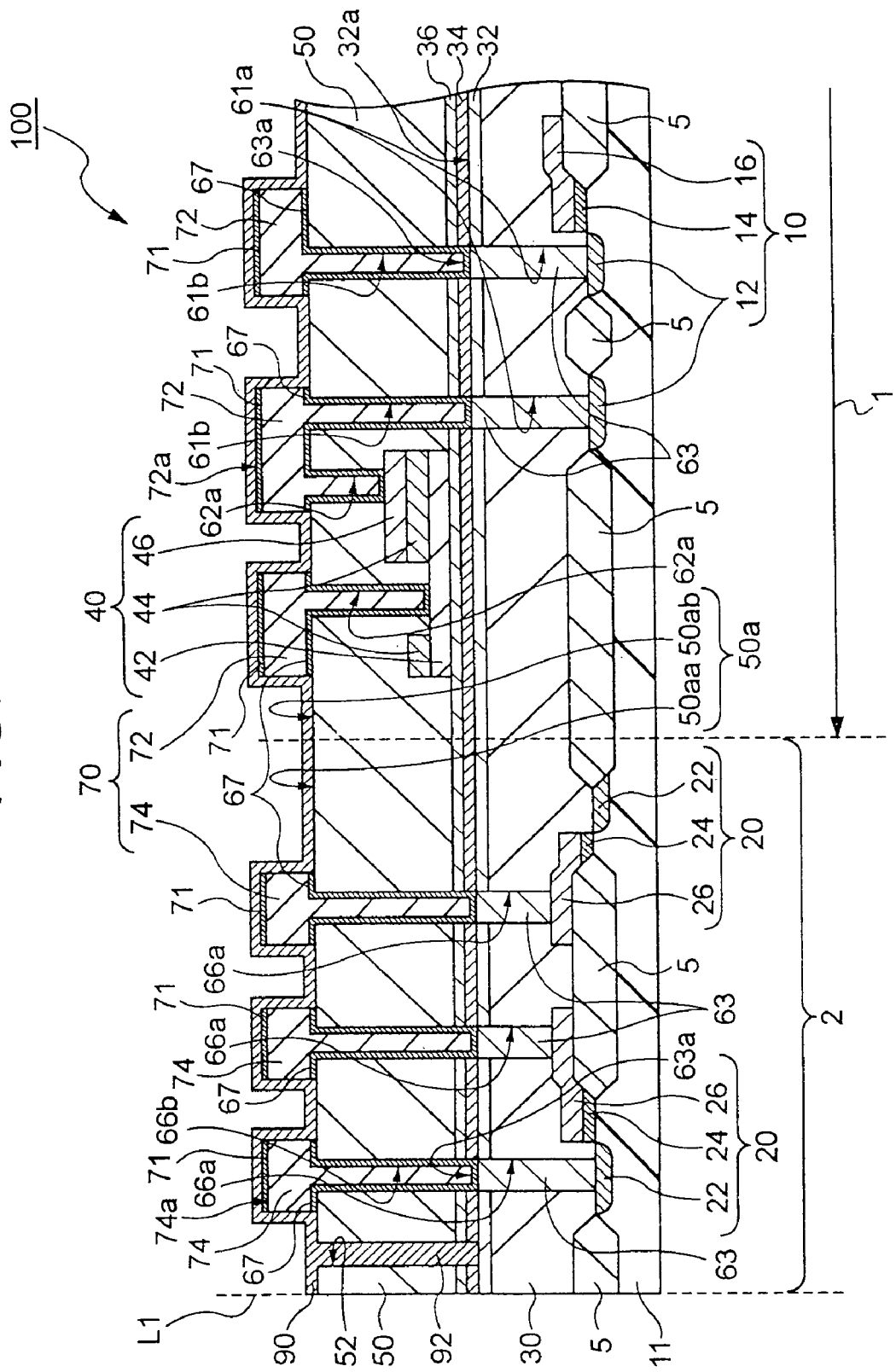

FERROELECTRIC MEMORY DEVICE AND METHOD OF MANUFACTURE OF SAME

BACKGROUND OF THE INVENTION

1. Field of the Invention

This invention relates to a ferroelectric memory device, having memory cells to store binary data as polarization states in a ferroelectric layer, and also relates to a method of manufacturing such a ferroelectric memory device.

2. Description of the Related Art

FeRAM (Ferroelectric Random Access Memory) devices are known as ferroelectric memories.

A ferroelectric layer in the FeRAM is formed from an oxide compound material. This oxide compound material undergoes a reduction reaction due to water ($H_2O$) and hydrogen ($H_2$) derived from this water which has irreversibly entered, for example, a CVD film formed in the vicinity of the ferroelectric layer. As a result of this reduction reaction, the polarization characteristics of the ferroelectric layer are degraded.

Japanese Patent Application Kokai (Laid-open) No. 2002-43541 discloses a configuration to prevent the diffusion into the ferroelectric layer of hydrogen arising from the process of formation of a passivation film. Specifically, a hydrogen diffusion prevention film of aluminum oxide ($Al_2O_3$) is provided on a metal wiring layer connected to the ferroelectric layer.

With the aim of reducing the effect of hydrogen occurring during formation of a passivation film, Japanese Patent Application Kokai No. 2003-100994 discloses a hydrogen diffusion prevention film of $Si_3N_4$ or SiON, having a film thickness of 10 nm to 200 nm and formed by reactive sputtering. The hydrogen diffusion prevention film is provided as a layer to cover the upper surface and side surfaces of the metal wiring.

According to Japanese Patent Applications Kokai No. 2002-43541 and No. 2003-100994, a hydrogen (or water) diffusion prevention film of aluminum oxide, $Si_3N_4$ or SiON is formed directly on the metal wiring.

When forming these prevention films, there is a possibility that a phenomenon called charge-up, in which the metal wiring is electrically charged, may occur. Details are described later.

The ALD (Atomic Layer Deposition) method is known as a method of film deposition which aims to resolve the drawbacks of conventional thermal CVD methods (see Japanese Patent Application Kokai No. 2004-023043).

As previously described, when a hydrogen (or water) diffusion prevention film is formed directly on metal wiring, charging-up of the metal wiring occurs. As a result, there is the possibility that the gate oxide film of transistors electrically connected to this metal wiring via buried contacts or other wiring structures connected to the metal wiring may be physically destroyed.

If the gate oxide film is destroyed, then logic circuit element functions such as control of memory cells are lost, and the device can no longer function properly as ferroelectric memory.

In general, the surface area of metal wiring formed in the logic circuit regions other than a memory cell array region is greater than the surface area (sum of the areas on the upper and side faces) of the first layer of metal wiring (first wiring layer) formed in the memory cell array region. The memory cell array region has a plurality of ferroelectric capacitors. Further, the wiring in the logic circuit region is directly connected to the gate electrodes of transistors. Hence destruction of the gate insulating films of the transistors due to charge-up occurs particularly easily in the logic circuit region.

In the conventional devices, a liner oxide film is formed prior to depositing a cover film, in order to prevent such charge-up. This liner oxide film is formed by for example the CVD method.

As described above, water is inevitably contained in a film formed by the CVD method. Moreover, this water may be decomposed in heat treatment to result in hydrogen.

Hence in order to prevent exposure of the ferroelectric layer to either water or to hydrogen, or to both, the prior art requires annealing at a temperature of approximately 400° C., with the purpose of dehydrating or dehydrogenizing the liner oxide film.

However, when annealing is performed under these conditions, there is the possibility of changes in the electrical characteristics of transistors formed in regions other than the memory cell array region in particular (e.g., in the logic circuit region). There is also the possibility of degradation of the ferroelectric layer characteristics.

Even if the liner insulating film is formed to a thickness of several hundred nanometers, the liner insulating film cannot prevent the above described problems.

SUMMARY OF THE INVENTION

An object of this invention is to provide a method of manufacturing a ferroelectric memory device enabling prevention of degradation of the electrical characteristics of the ferroelectric memory cell array and logic circuitry, which would be otherwise caused by charge-up and similar in manufacturing processes.

A further object of this invention is to provide a ferroelectric memory device having a ferroelectric memory cell array with excellent electrical characteristics in the initial state (at time of shipment) and improved performance, as well as logic circuitry free from degradation of electrical characteristics.

According to one aspect of the present invention, there is provided an improved method of manufacturing a ferroelectric memory device. This manufacturing method includes forming a lower insulating film on a semiconductor substrate. The manufacturing method also includes forming a ferroelectric capacitor structure, by layering in order, on top of the lower insulating film, a lower electrode, ferroelectric layer, and upper electrode. The manufacturing method also includes forming an upper insulating film which covers the ferroelectric capacitor structure. The manufacturing method also includes forming a wiring layer, which extends over the upper insulating layer. The wiring layer is electrically connected to the ferroelectric capacitor structure, memory cell elements, and logic circuit elements. The manufacturing method also includes forming a barrier film, which covers the wiring layer and upper insulating film. The barrier film may be an aluminum oxide film having a film thickness of 5 to 50 nm.

The barrier film formation may be performed using an ALD method, so that the wiring layer can be covered directly, and there is no danger of the occurrence of charge-up. Because charge-up is prevented, there is no occurrence of the destruction in the logic circuit region, and particularly of gate insulating film. Thus, the problem of the conventional manufacturing processes is solved. Therefore, the formation of a liner oxide film which had been necessary to prevent gate insulating film destruction is no longer necessary, and the annealing under conditions which had been necessary in the prior art is also no longer necessary. Hence simpler processes can be used to provide a ferroelectric memory device without degradation of initial characteristics of the ferroelectric memory cell array which would otherwise be caused upon formation of a liner oxide film.

As a result, the manufacturing yield of ferromagnetic memory devices is improved. Further, there is no longer a need to consider the antenna ratio (the value of the surface area of wiring connected to the gate electrode, divided by the gate area), so that there is greater freedom in wiring layout design. In other words, the wiring design can be optimized, so that a ferroelectric memory device can be provided with improved wiring electrical characteristics.

According to a second aspect of the present invention, there is provided a ferroelectric memory device that includes a semiconductor substrate, on which are provided a plurality of elements such as a plurality of memory cell elements and a plurality of logic circuit elements. The ferroelectric memory device also includes a lower insulating film, provided on the semiconductor substrate. The ferroelectric memory device also includes a lower hydrogen barrier film, provided on the lower insulating film. The ferroelectric memory device also includes a ferroelectric capacitor structure, provided on the lower hydrogen barrier film by layering in order a lower electrode, ferroelectric layer, and upper electrode. The ferroelectric memory device also includes an upper insulating film, which covers the ferroelectric capacitor structure. The ferroelectric memory device also includes a wiring layer, which extends over the upper insulating film. The wiring layer is electrically connected to the ferroelectric capacitor structure, memory cell elements, and logic circuit elements. The ferroelectric memory device also includes an upper hydrogen barrier film, which covers the wiring layer and the upper insulating film. The upper hydrogen barrier film may be an aluminum oxide film having a film thickness of 5 to 50 nm.

According to this ferroelectric memory device, a liner oxide film is not provided in the memory cell array region and peripheral circuit region, so that there is no degradation of the ferroelectric layer due to water or hydrogen diffusing from a liner oxide film.

The barrier film may be formed by the ALD method. This barrier film has a particularly high film density (g/cm$^3$), and has excellent step coverage properties. Consequently, this barrier film can effectively prevent hydrogen or water from reaching the ferroelectric layer. Because the barrier film has excellent film properties, the barrier film can more effectively protect the ferroelectric layer.

Consequently, the ferroelectric memory device having the high-performance ferroelectric memory cell array is obtained, and the ferroelectric memory device undergoes little degradation of electrical characteristics due to use.

If the edge portion of the barrier film is buried in a trench portion surrounding the wiring layer, then it is possible to prevent the invasion of hydrogen and water not only from the upper face during the manufacturing process, but also from the direction of the side face portions when the ferroelectric memory device is formed into a chip. Hence the ferroelectric layer can be protected still more effectively.

BRIEF DESCRIPTION OF THE DRAWINGS

FIG. 1A is a schematic plan view used to describe the constituent components of the ferroelectric memory device according to a first embodiment of the invention;

FIG. 1B is a cross-sectional view of the ferroelectric memory device shown in FIG. 1A, taken along the broken line 1B-1B in FIG. 1A;

FIG. 4A, FIG. 4B and FIG. 4C is a series of diagrams of manufacturing processes, showing a cross-sectional view taken along the broken lines 4A-4A, 4B-4B and 4C-4C in FIG. 1A, respectively;

DETAILED DESCRIPTION OF THE INVENTION

Figure 2:
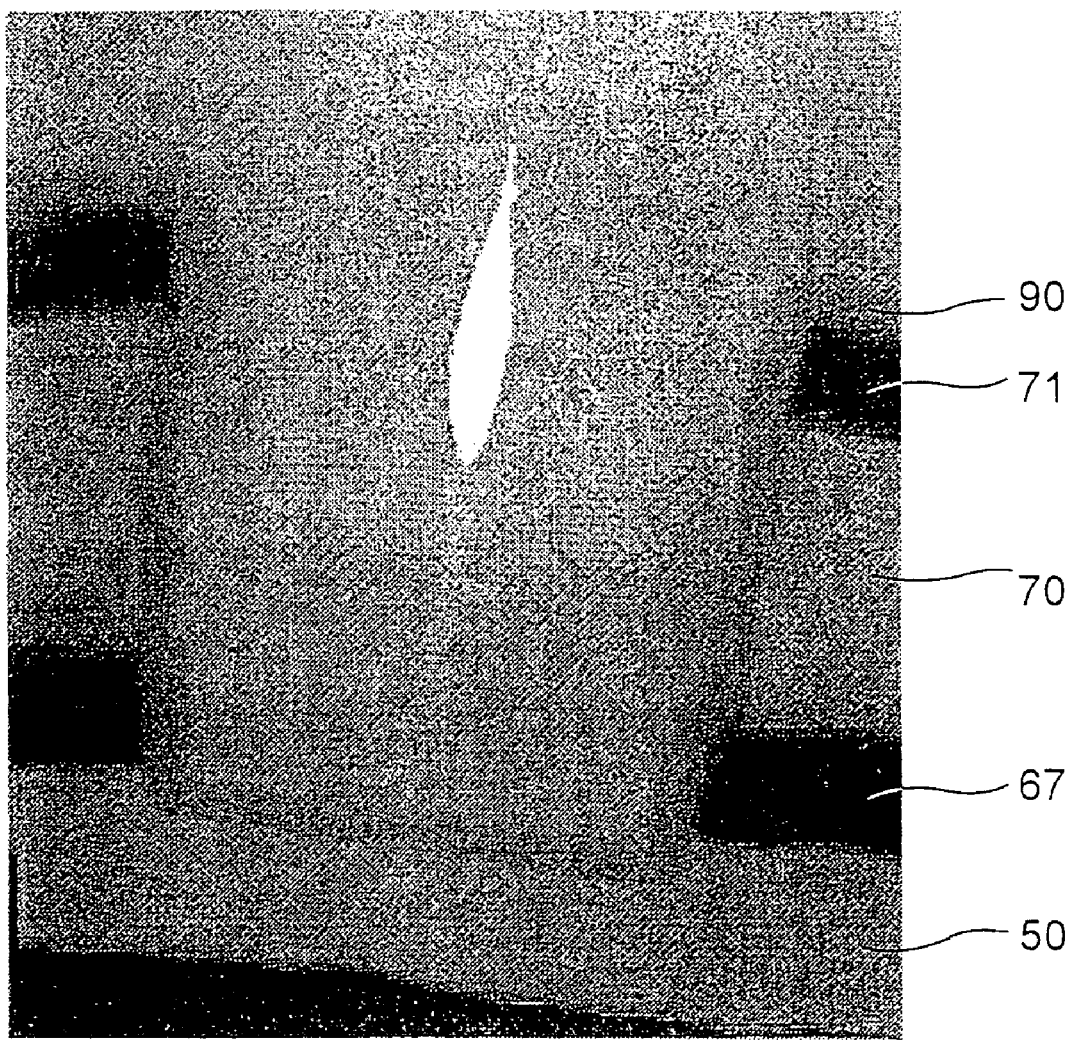
FIG. 2 is a photograph taken using a transmission electron microscope of a cross-section of an exemplary ferroelectric memory device of this invention.

Below, embodiments of the invention are described with reference to the drawings. It should be understood that in the drawings, each of the constituent components is shown in only summary fashion sufficient to enable understanding of the invention, and that the numerical conditions and similar presented below are merely illustrative examples.

First Embodiment

A first embodiment of a ferroelectric memory device of this invention will be described, referring to FIG. 1A and FIG. 1B.

FIG. 1A is a schematic plan view of the ferroelectric memory device 100 of the first embodiment of the invention. FIG. 1B is a cross-sectional view.

As shown in FIG. 1A and FIG. 1B, the ferroelectric memory device 100 has the form of a so-called (semiconductor) chip. In the illustrated embodiment, the ferroelectric memory device 100 has the shape of a rectangular parallelepiped.

The ferroelectric memory device 100 includes a semiconductor substrate 11 which is planar and square in shape. A plurality of regions are defined on the semiconductor substrate 11. In this embodiment, the substrate is demarcated into two regions, which are a square memory cell array region (first region) 1, and a logic circuit region (second region) 2 surrounding the memory cell array region 1. This demarcation example is no more than an illustrative example; for example, other regions, having elements or circuits such as I/O circuits, analog circuits, RF circuits, and microcomputers, may be defined on the substrate 11.

Here "region" means a three-dimensional region, which includes constituent elements provided on the semiconductor substrate 11.

Memory cell elements 10 are provided in the memory cell array region 1. Logic circuit elements 20 are provided in the logic circuit region 2. These memory cell elements 10 and logic circuit elements 20 are isolated from each other by an element isolation structure, such as a field oxidation film 5 formed by a LOCOS method or by another element isolation process.

In the memory cell array region 1, a plurality of memory cells, each having a ferroelectric layer 44 and memory cell element 10, are arranged in a matrix.

Each memory cell element 10 includes for example a transistor and/or other element(s) having an ordinary configuration. The memory cell element 10 has, for example, as the constituent components of the transistor, a memory cell diffusion region 12, a memory cell gate insulating film (gate oxide film) 14, and a memory cell gate electrode 16 provided on the memory cell gate insulating film 14.

The memory cell diffusion region 12 is for example an ion diffusion region in which appropriate ions are implanted under known conditions. The memory cell gate insulating film 14 is for example a silicon oxide film formed by a thermal oxidation process. The memory cell gate electrode 16 is for example a metal electrode.

Logic circuit elements 20 are formed in the logic circuit region 2.

Similar to the memory cell elements 10, the logic circuit elements 20 include transistors and other elements. The logic circuit elements 20 have decoder circuits which are connected to the memory cell array to control the memory cell operation.

Each logic circuit element 20 has, as transistor constituent components, a logic circuit element diffusion region 22, a logic circuit element gate insulating film 24, and a logic circuit element gate electrode 26 provided on the logic circuit element gate insulating film 24.

A first insulating film (lower insulating film) 30 is provided on the memory cell array region 1, in which the memory cell elements 10 are provided, and on the logic circuit region 2, in which the logic circuit elements 20 are provided. That is, the first insulating film 30 is provided over the entire upper side of the substrate 11, on which have been formed memory cell elements 10 and logic circuit elements 20. It is preferable that the first insulating film 30 be an $O_3$-TEOS BPSG film (hereafter also simply called a BPSG film), deposited using for example ozone ($O_3$) in a CVD method with TEOS as material. It is preferable that the thickness of the first insulating film 30 be approximately 850 nm.

A second insulating film 32 is provided on the first insulating film 30. It is preferable that the second insulating film 32 be a P-TEOS film. This second insulating film 32 is a film to prevent moisture absorption by the BPSG film. The BPSG film is the first insulating film 30.

In the first insulating film 30 and second insulating film 32 are provided a plurality of contact holes, which penetrate the films. The contact holes extend to the memory cell elements 10 and logic circuit elements 20. The contact holes have first memory cell contact holes 61a in the first region 1, and first logic circuit contact holes 66a in the second region 2.

Within each of these first memory cell contact holes 61a and first logic circuit contact holes 66a is provided a metal film (not shown) as a barrier metal. It is preferable that this metal film be a layered structure of, for example, a titanium (Ti) film with a film thickness of approximately 15 nm and a titanium nitride (TiN) film with a film thickness of approximately 20 nm.

Each contact hole 61a, 66a whose inner walls are coated with this metal film is filled with (plugged) by a conductive material such as tungsten (W), to form the plug 63. The top faces 63a of the plugs 63 are coplanar to the surface 32a of the second insulating film 32.

A third insulating film 34 is provided on the second insulating film 32. It is preferable that the third insulating film 34 be a silicon nitride film (SixNy: $Si_3N_4$) of thickness approximately 100 nm, or an aluminum oxide (AlxOy: $Al_2O_3$, simply called alumina) film of thickness approximately 5 to 50 nm. This third insulating film 34 is a film to protect the plugs 63, which would otherwise be oxidized in the high-temperature treatment generally performed for the purpose of recovery of the characteristics of the ferroelectric layer 44. This heat treatment is called a recovery annealing process. The third insulating film 34 also blocks hydrogen or water which would otherwise diffuse from the structures below the third insulating film 34 and penetrate the ferroelectric layer 44. Hence the third insulating film 34 is also called a lower hydrogen barrier film.

On the third insulating film 34 is provided a fourth insulating film 36. Preferably the fourth insulating film 36 is a tantalum oxide film (Taxoy: $Ta_2O_5$). The fourth insulating film 36 is an adhesion layer for the lower electrode 42.

A ferroelectric capacitor structure 40 is provided on the fourth insulating film 36 within the memory cell array region 1. The ferroelectric capacitor structure 40 has a known configuration. Specifically, the ferroelectric capacitor structure 40 has a structure in which the lower electrode 42, ferroelectric layer 44, and upper electrode 46 are layered in order.

It is preferable that the lower electrode 42 and upper electrode 46 be platinum (Pt) electrodes. The ferroelectric layer 44 can adopt as material lead zirconate titanate (PZT), La-doped PZT (PLZT), or SBT ($SrBi_2Ta_2O_9$). It is preferable that the ferroelectric layer 44 be an SBT film.

A fifth insulating film (upper insulating film) 50 covers the ferroelectric capacitor structure 40. The fifth insulating film 50 is provided over the entire surface of the fourth insulating film 36. In other words, the fifth insulating film 50 extends over the memory cell array region 1 and the logic circuit region 2. It is preferable that the fifth insulating film 50 be a TEOS-silicon oxide film.

Second memory cell contact holes 61b and second logic circuit contact holes 66b are provided in the fifth insulating film 50.

Capacitor contact holes 62a are provided in the memory cell array region 1. The capacitor contact holes 62a extend from the surface 50a of the fifth insulating film 50 to the ferroelectric capacitor structures 40.

Second memory cell contact holes 61b are provided within the memory cell array region 1, and connect the surface 50a of the fifth insulating film 50 to plugs 63 connected to the memory cell elements 10.

The second logic circuit contact holes 66b are provided in the logic circuit region 2, and extend from the surface 50a of the fifth insulating film 50 to penetrate the fifth insulating film 50, fourth insulating film 36, and third insulating film 34. The logic circuit contact holes 66b are opened extending to the upper faces 63a of the plugs 63.

A barrier metal 67 is provided on the inner surfaces (inner walls) of the second memory cell contact holes 61b and second logic circuit contact holes 66b. It is preferable that the barrier metal 67 be a titanium nitride film or tantalum nitride film. The barrier metal 67 may be a zirconium nitride (ZrN) film or a tungsten nitride (WN) film.

A wiring layer 70 having a plurality of wiring portions is provided on the surface 50a of the fifth insulating film 50. The barrier metal 67 extends under the wiring layer 70 on the surface 50a. The wiring layer 70 is provided so as to fill the second memory cell contact holes 61b, second logic circuit contact holes 66b, and capacitor contact holes 62a. Thus, the wiring layer 70 is electrically connected to the plugs 63, upper electrodes 46, and lower electrodes 42.

The wiring layer 70 has first wiring portions 72 and second wiring portions 74. The first wiring portions 72 are provided extending over first partial surface regions 50ab, which are within the memory cell array region 1 of the fifth insulating film 50. The first wiring portions 72 are electrically connected to the upper electrodes 46, lower electrodes 42, and plugs 63 in the memory cell array region 1.

The second wiring portions 74 are provided extending over second partial surface regions 50aa, which are within the logic circuit region 2. The second wiring portions 74 are electrically connected to the plugs 63 in the logic circuit region 2. The first and second wiring portions 72 and 74 are not electrically connected to each other within the wiring layer 70.

It is preferable that the wiring layer 70 be metal wiring of aluminum (Al), or an aluminum alloy with silicon (Si) and copper (Cu) or copper alone added. Alternatively, the wiring layer 70 may be made from copper, or a copper alloy with silver (Ag), titanium (Ti), manganese (Mn), magnesium (Mg), or tin (Sn) added.

A reflection-prevention film 71 is provided on the upper faces 72a and 74a of the wiring layer 70 (first wiring portions 72 and second wiring portions 74).

A barrier film 90 is provided over the entire upper surface of the fifth insulating film 50, on which the wiring layer 70 (first wiring portions 72 and second wiring portions 74) is provided. That is, the barrier film 90 extends from the logic circuit region 2, on which the second wiring portions 74 are provided, to the memory cell array region 1, in which the first wiring portions 72 are provided. The barrier film 90 is a thin film of aluminum oxide. The barrier film 90 prevents the intrusion into the ferroelectric layer 44 of hydrogen and water generated by the configuration provided on the wiring layer 70 in particular. Hence in the following, this barrier film 90 is also called an upper hydrogen barrier film.

The ferroelectric memory device 100 of this embodiment is characterized in that this barrier film 90 is of extremely good quality, and is formed by an atomic layer deposition (ALD) method.

Details are described later, but because an aluminum oxide film formed by the atomic layer deposition method can be deposited in atomic layer units, the film thickness can be easily controlled, and 100% step coverage can be attained. If the deposited film is thick in certain areas and thin in others, there may be adverse effects on the apertures of through-holes, causing worsening of electrical characteristics; but if a film with excellent step coverage can be formed, such problems do not arise. A good-quality film with excellent coverage properties exhibits superior hydrogen/water diffusion prevention performance, if compared with other films having the same deposited film thickness.

By using an aluminum oxide film formed by such an atomic layer deposition method, the deposited thickness of the barrier film 90 can be significantly reduced. Specifically, the thickness of the barrier film 90 can be held within the preferred range of approximately 5 nm to 50 nm.

If the aluminum oxide film formed by the ALD method has approximately such a thickness, hydrogen and water intruding into the ferroelectric layer 44 from the upper layers can be blocked.

An aluminum oxide film with excellent (better) step coverage compared with the prior art is provided, so that the residual polarization in the ferroelectric layer 44 can be further improved. As a result, a high-performance ferroelectric memory device 100 with excellent polarization characteristics can be provided.

Further, the aluminum oxide film can be made thinner, with better step coverage, so that even when a wiring structure with a greater number of layers is necessary, or when the diameters of through-holes become smaller in keeping with increasingly finer process rules in device manufacturing, it is still possible to prevent degradation of electrical characteristics.

Here, the step coverage of an aluminum oxide film formed by the ALD method is described with reference to FIG. 2.

FIG. 2 is a copy of a photograph, taking with a transmission electron microscope, of a cross-sectional view of a ferroelectric memory device 100 (manufacturing processes are described later).

On top of the wiring layer 70 is deposited an aluminum oxide film, as the barrier film 90, to a thickness of 50 nm using the ALD method.

As is clear from FIG. 2, the aluminum oxide film (i.e., the barrier film) 90 formed by the ALD method is created with uniform film thickness and there is no overhang on the side face of the wiring layer 70 and on the reflection prevention film 71.

The ferroelectric memory device 100 may have a multilayer wiring structure including second and third wiring layers electrically connected with the wiring layer 70, with the wiring layer 70 as a first wiring layer. In this configuration, contact holes penetrate the barrier film 90 on this first wiring layer. However, such a modification is not the gist of this invention, and so a drawing and detailed explanation are omitted.

Second Embodiment

A second embodiment of a ferroelectric memory device 100 according to the present invention is described with reference to FIG. 3A and FIG. 3B.

Figure 3A:
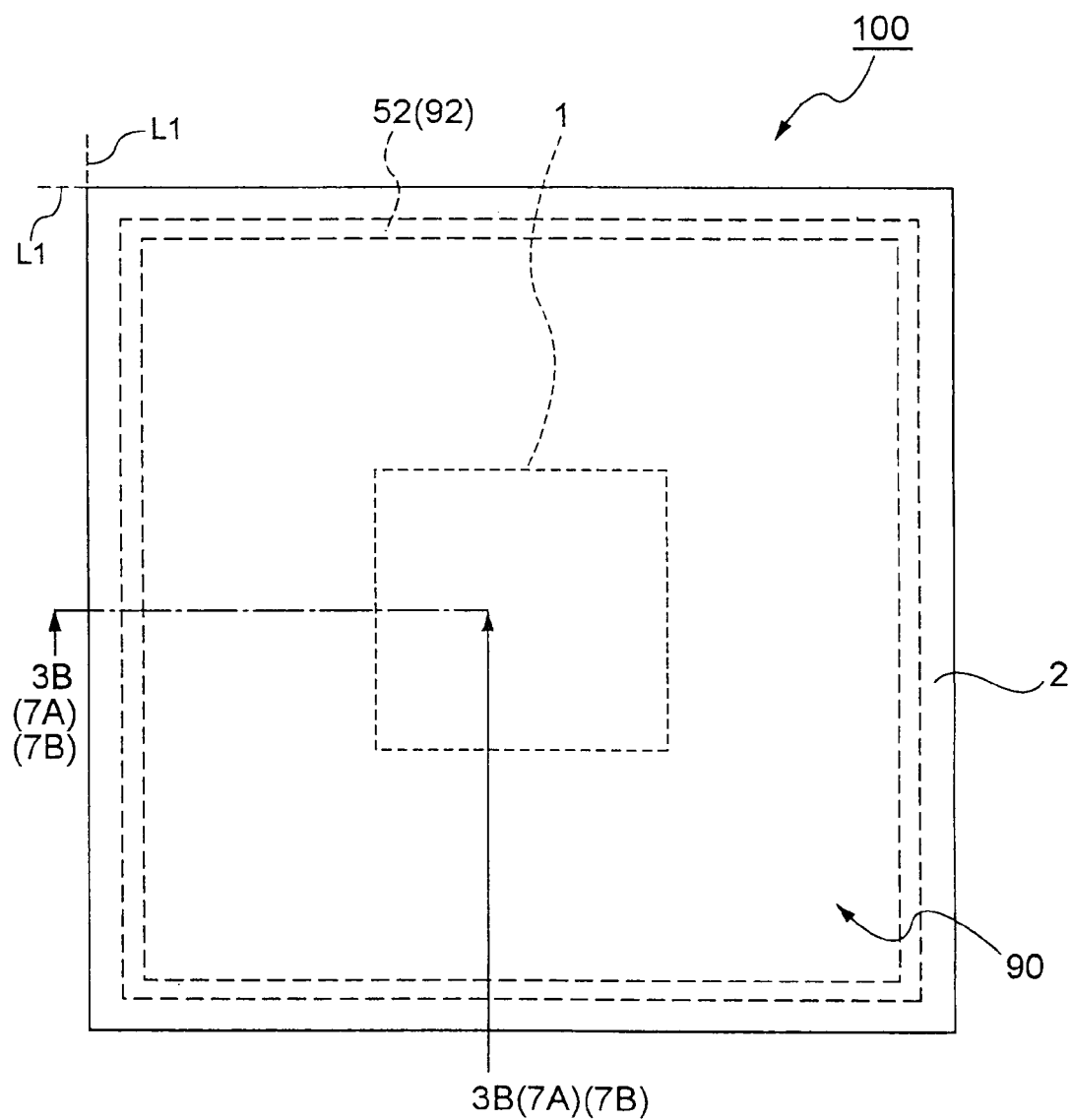
FIG. 3A is a schematic plan view of the ferroelectric memory device according to a second embodiment of the invention.

FIG. 3A is a schematic plan view of a ferroelectric memory device 100. FIG. 3B is a cross-sectional view taken along the broken line 3B-3B in FIG. 3A.

The ferroelectric memory device 100 of this embodiment is characterized by the shape of the barrier film 90. Because there are almost no changes in the other constituent components when compared to the first embodiment, only the modified portions are described; components for which there are no changes are assigned the same reference numbers and symbols in the first and second embodiments, and a detailed explanation is omitted.

Figure 3B:
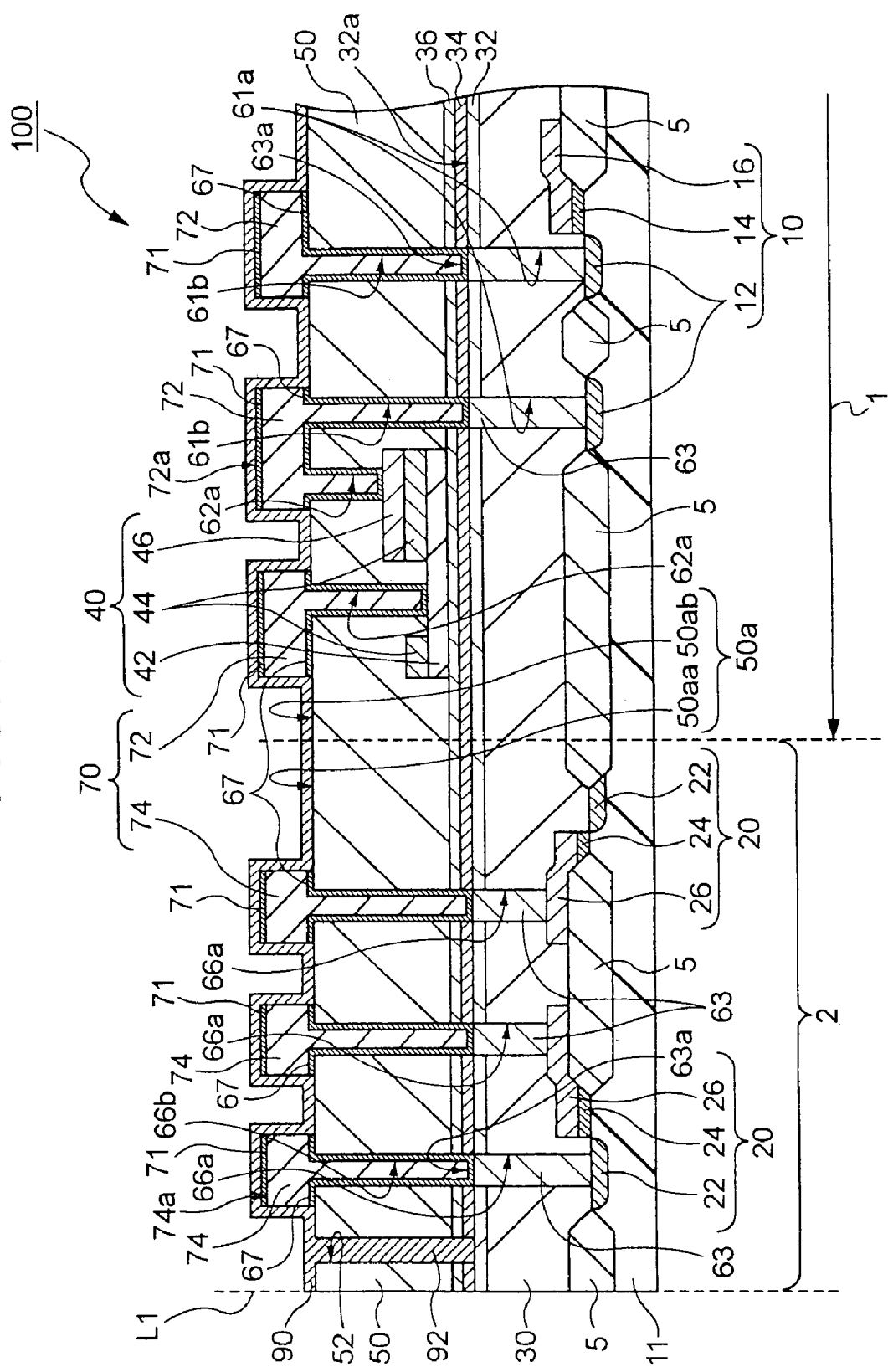
FIG. 3B is a cross-sectional view of the ferroelectric memory device shown in FIG. 3A, taken along the broken line 3B-3B in FIG. 3A.

As shown in FIG. 3A and FIG. 3B, a portion of the barrier film 90 is buried in the layered structure of the ferroelectric memory device 100.

Specifically, a closed square trench portion 52 is provided in the fifth insulating film 50. The trench portion 52 also covers the fifth insulating film 50 and ferroelectric capacitor structures 40. In the illustrated embodiment the trench portion 52 is provided in the logic circuit region 2 surrounding the memory cell array region 1. That is, the trench portion 52 extends along and on the inside of the scribe line L1. The scribe line L1 is a cutting line to be used in the individuation process.

It is preferable that the depth of this trench portion 52 be sufficient to penetrate the fourth insulating film 36 and extend to the surface of the third insulating film 34. It is still more preferable that the depth of the trench portion 52 be sufficient to penetrate the fourth insulating film 36 and the third insulating film 34, and extend to the surface 32a of the second insulating-film 32.

The trench portion 52 can be provided in an arbitrary appropriate region with an appropriate width as long as the trench portion 52 does not adversely affect the functions of the ferroelectric memory device 100.

It is preferable that the trench portion 52 be provided at a distance of approximately 10 μm from the scribe line L1. It is preferable that the width of the trench portion 52 be approximately 1 μm.

A portion of the barrier film 90 in this embodiment fills up the trench portion 52 to form a buried portion (filler portion) 92.

The barrier film 90 is an aluminum oxide film, formed by the ALD method, having extremely good film quality, so that filling up of the trench portion 52 can also be performed with extremely high precision.

The buried portion 92 blocks hydrogen and/or water from intruding into the ferroelectric layer 44 from the cut surface formed in the individuation process performed along the scribe lines L1, that is, from the side faces of the ferroelectric memory device 100. In particular, if a configuration is employed in which the buried portion 92 is in contact with the surface 32a of the second insulating film 32, then the ferroelectric capacitor structure 40 having the ferroelectric layer 44 is surrounded and encapsulated by the barrier film 90 which is the upper hydrogen barrier film, the buried portion 92 of the barrier film 90, and the third insulating film 34 which is the lower hydrogen barrier film; hence during and after the individuation process in particular, hydrogen and/or water from outside these structures can be blocked. As a consequence, degradation of the ferroelectric layer 44 can be prevented more effectively.

Method of Manufacture of a Ferroelectric Memory Device of the First Embodiment:

Next, a method of manufacturing a ferroelectric memory device 100 shown in FIG. 1A and FIG. 1B is described with reference to FIGS. 4A to 4C and FIGS. 5A to 5B.

It should be noted that numerous ferroelectric memory devices are formed simultaneously on a single wafer, but in order to avoid complexity in the drawings and description of the manufacturing method, only a portion of the ferroelectric memory devices, that is, only a memory cell array region having a single memory cell and a logic circuit region are described below, using a cross-sectional view similar to FIG. 1B.

Figure 4A:
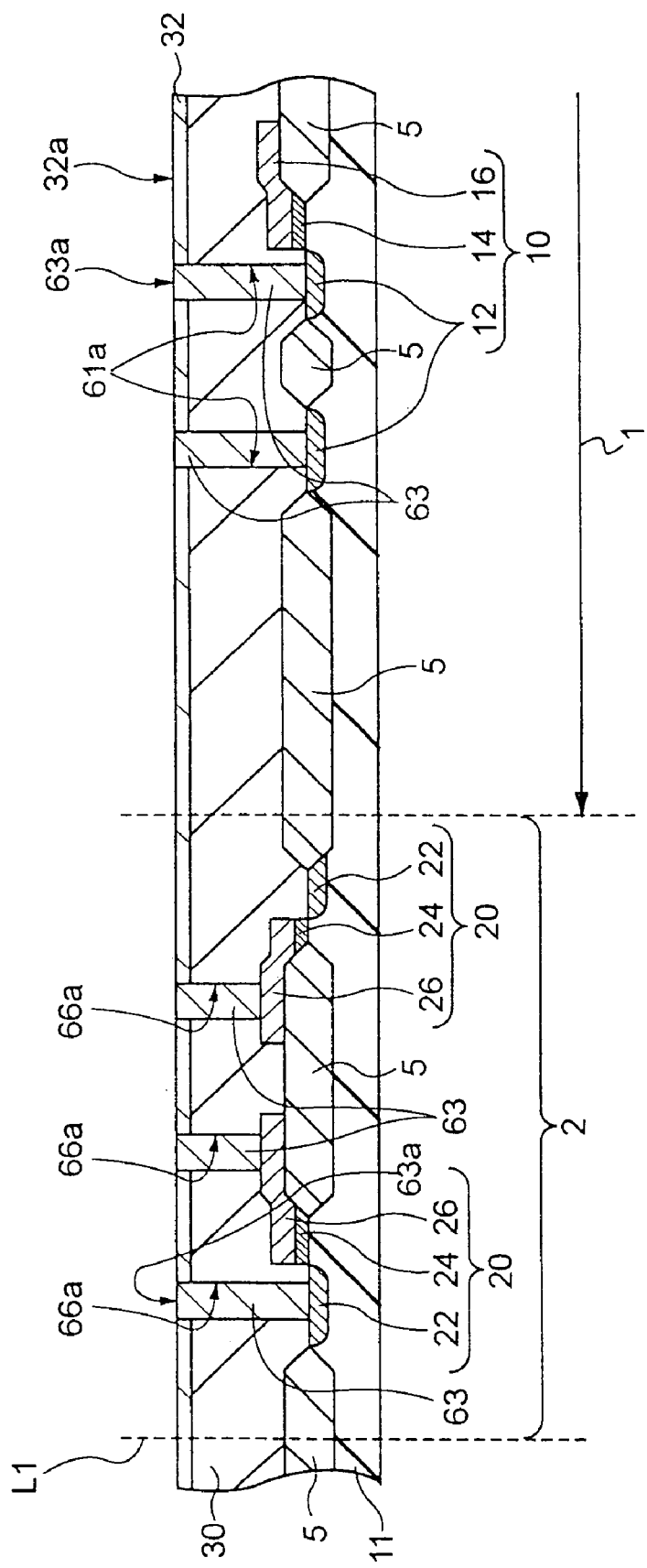
Figure 4B:
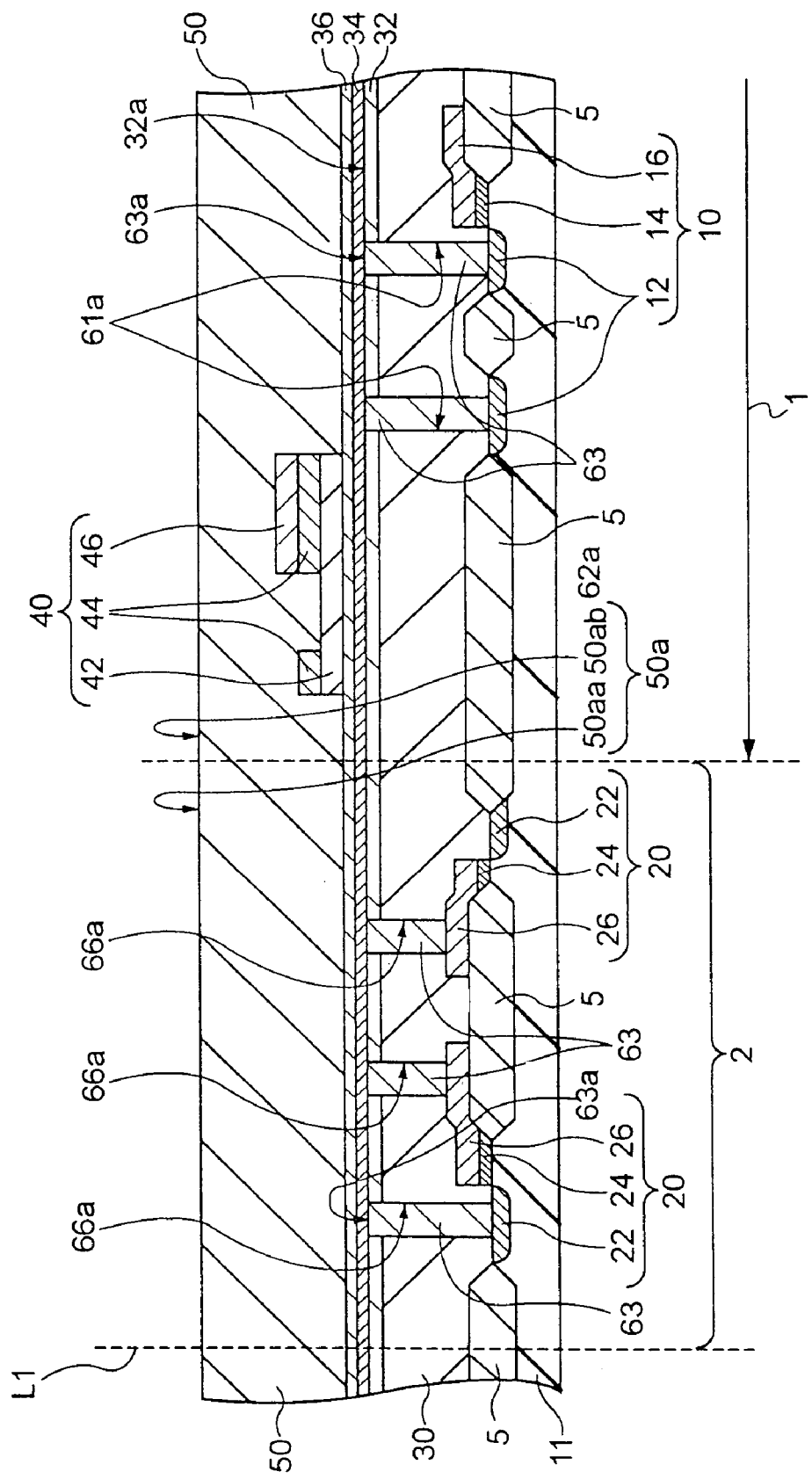
Figure 5A:
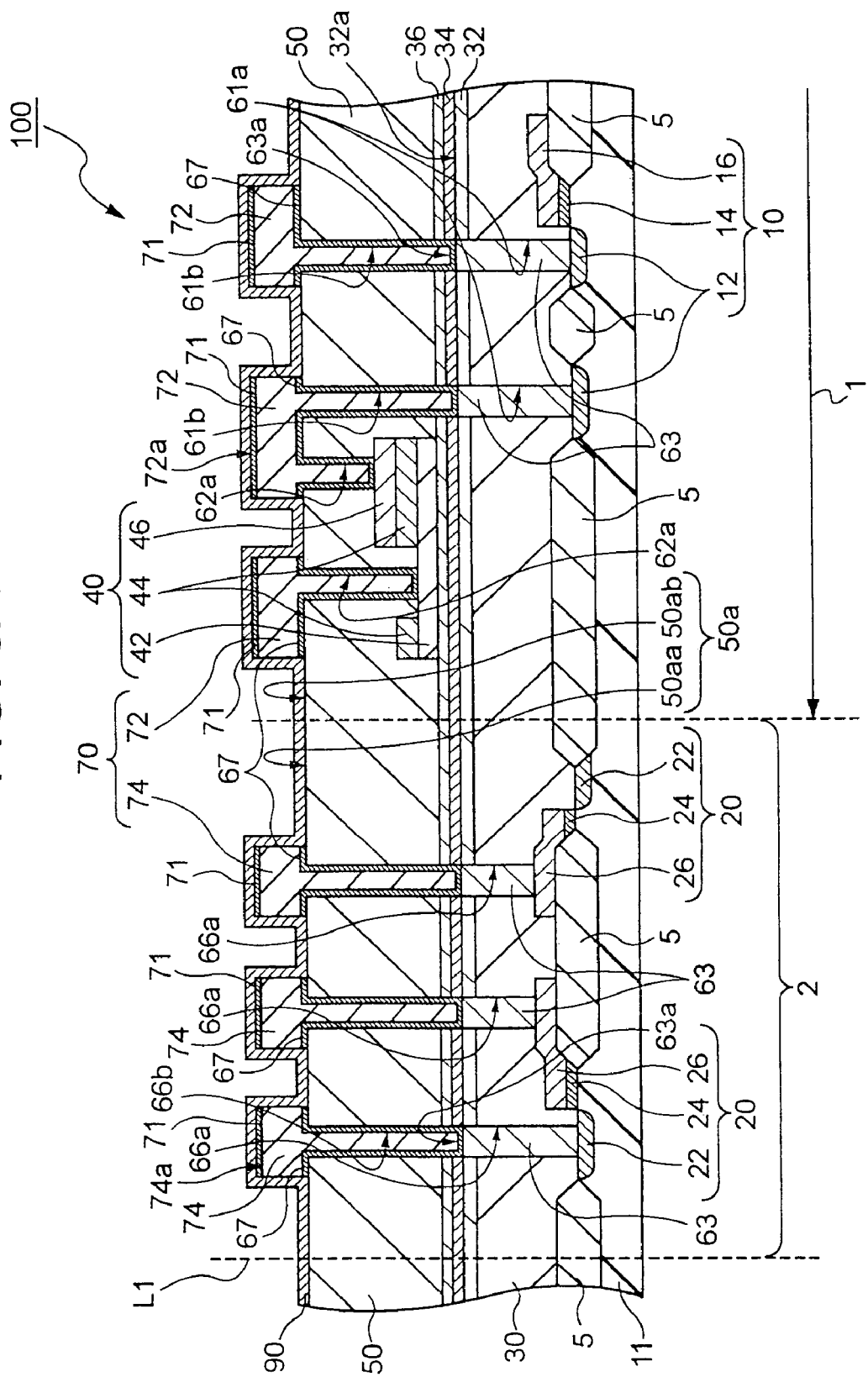
FIG. 5A is a diagram of a manufacturing process in succession to FIG. 4C, showing a cross-sectional view taken along the broken line 5A-5A in FIG. 1A.
Figure 5B:
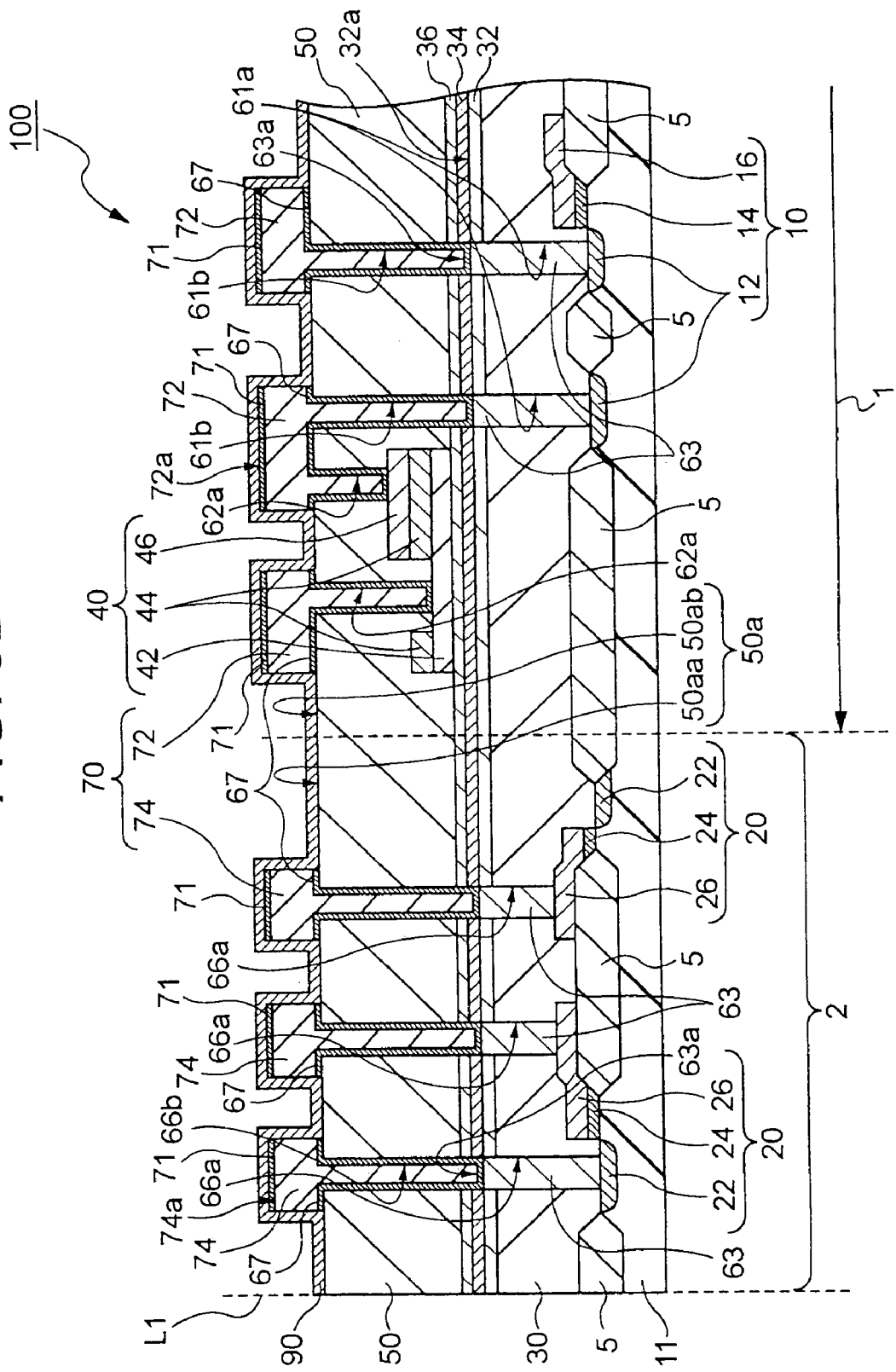
FIG. 5B is a diagram of a manufacturing process in succession to FIG. 5A, showing a cross-sectional view taken along the broken line 5B-5B in FIG. 1A.

FIG. 4A to FIG. 5B is a series of diagrams of manufacturing processes of a ferroelectric memory device during manufacturing at the wafer level. FIG. 4A shows a cross-sectional view taken along the broken line 4A-4A in FIG. 1A, FIG. 4B shows a cross-sectional view taken along the broken line 4B-4B, and FIG. 4C shows a cross-sectional view taken along the broken line 4C-4C. FIG. 5A is a diagram in succession to FIG. 4C, and FIG. 5B is a diagram in succession to FIG. 5B.

As shown in FIG. 4A, first, taking a memory cell array region 1 and a logic circuit region 2 surrounding the memory cell array region 1 to be one group, a plurality of such groups are demarcated in a matrix on a semiconductor substrate (wafer) 11.

Next, common wafer processes are used to fabricate a memory cell element 10 in the memory cell array region 1 on the semiconductor substrate 11. A logic circuit element 20 is fabricated in the logic circuit region 2.

Specifically, for example, the LOCOS method is used to form a field oxide film 5, that is, an element isolation structure.

Next, normal methods are used to fabricate, in the memory cell array region 1, a memory cell gate insulating film 14, and a memory cell gate electrode 16 provided on the memory cell gate insulating film 14. In the logic circuit element region, a logic circuit element gate insulating film 24 is formed, and a logic circuit element gate electrode 26 is formed on the logic circuit element gate insulating film 24. Diffusion layers will be formed after formation of contact holes so that that at this time neither the memory cell element 10 nor the logic circuit element 20 has a diffusion layer.

Next, a first insulating film 30 is deposited on the entire surface of the memory cell array region 1 in which memory cell elements 10 are fabricated and the logic circuit region 2 in which logic circuit elements 20 are fabricated, except for the exposed surface of the semiconductor substrate 11, that is, the diffusion layer. The film thickness of the first insulating film 30 is for example approximately 850 nm.

Normal methods may be used to deposit the first insulating film 30. Preferably using ozone ($O_3$), with TEOS as the starting material, a CVD method is employed to deposit an $O_3$-TEOS BPSG film.

Next, a known method is used to form a second insulating film 32 on the first insulating film 30. The second insulating film 32 is deposited as a P-TEOS film (silicon oxide film) of thickness approximately 100 nm. Hence the second insulating film 32 may be deposited using a CVD method.

Next, a plurality of contact holes are formed by normal photolithography and etching processes in the first and second insulating films 30 and 32. These contact holes extend to the substrate surface and the gate electrodes; that is, these contact holes are the previously-described first memory contact holes 61a of the first region 1 and the first logic circuit contact holes 66a of the second region 2.

Next, normal methods are used to perform ion implantation and thermal diffusion processes in the exposed substrate surface from the contact holes, via the first memory cell contact hole 61a and first logic circuit contact hole 66a, as shown in FIG. 4A. The ion implantation process is a process of implanting, for example, $P^+$ or $BF^{2+}$ ions. After this, a thermal diffusion process is performed to induce thermal diffusion of the implanted ions. This thermal diffusion process is performed by heat treatment at a temperature of, for example, 1000° C. for approximately 10 seconds.

By means of this process, a memory cell element diffusion region 12 and logic circuit element diffusion region 22 are formed, and a memory cell element 10 and logic circuit element 20 are formed.

Next, common methods are used to form, on the insides (inner walls) of the first memory cell contact hole 61a and first logic circuit contact hole 66a, a metal film (not shown), such as a layered structure of an approximately 15 nm thick titanium (Ti) film and an approximately 20 nm thick titanium nitride (TiN) film.

Next, common methods are used to fill up the first memory cell contact hole 61a and first logic circuit contact hole 66a coated with this metal film. By means of this process, the first memory cell contact hole 61a and first logic circuit contact hole 66a are filled with a conductive material such as tungsten (W), to form the plugs 63.

Next, a third insulating film 34 is formed to cover the entire exposed surface, that is, the surface 32a of the second insulating film 32 and the upper faces 63a of the plugs 63, as shown in FIG. 4B. It is preferable that the deposited third insulating film 34 be a silicon nitride film. Specifically, the plasma CVD method may be employed to deposit the film to a thickness of approximately 100 nm.

On the third insulating film 34 is formed a P-TEOS NSG film (not shown) to a thickness of approximately 150 nm. On this P-TEOS NSG film is formed a fourth insulating film 36, which is preferably a tantalum oxide film. The process of deposition of the fourth insulating film 36 may be performed by normal sputtering methods, using tantalum (Ta) as the target and a mixture of argon (Ar) and oxygen ($O_2$) as the process gas.

Next, normal methods are used to form a ferroelectric capacitor structure 40 on the fourth insulating film 36 in the memory cell array region 1.

Specifically, known methods are used to deposit, in order, a lower electrode 42 of platinum or similar, a ferroelectric layer 44 of the SBT film material, and an upper electrode 46 of platinum or another film material.

To deposit the platinum film, a normal sputtering process may be used. For example employing platinum as the target and argon as the process gas, the film is deposited to an appropriate thickness. An SBT film can be deposited by performing normal spin-coating and calcining methods repeatedly until a desired film thickness is reached. Thereafter, a normal photolithography process and etching process may be used to form a plurality of ferroelectric capacitor structures 40 in a matrix shape within the memory cell array region 1.

Next, a fifth insulating film 50 is deposited. The fifth insulating film 50 is formed across the memory cell array region 1 and logic circuit region 2. That is, the fifth insulating film 50 is formed so as to cover the ferroelectric capacitor structures 40. The fifth insulating film 50 is for example a silicon oxide film created using TEOS material. The fifth insulating film 50 may be formed by a known plasma CVD method.

Next, as shown in FIG. 4C, a normal method is used to form contact holes in the surface 50a of the fifth insulating film 50, that is, in the memory cell array region 1 and in the logic circuit region 2. In the memory cell array region 1, capacitor contact holes 62a, extending to the ferroelectric capacitor structures 40, and second memory cell contact holes 61b, extending to (exposing) the upper faces 63a of the plugs 63 connected to the memory cell elements 10, are formed. In the surface 50a of the fifth insulating film 50 in the logic circuit region 2, second logic circuit contact holes 66b are formed, extending to the upper faces 63a of the plugs 63 connected to the logic circuit elements 20.

The process of formation of these contact holes can rely on normal photolithography processes and etching processes. After completion of the process to form the contact holes, a so-called recovery annealing process is performed. Specifically, heat treatment is performed in an oxygen ($O_2$) atmosphere at 600° C. to 750° C. for from 0.5 hour to 1 hour. By means of this process, the electrical characteristics of the ferroelectric layer 44, which are degraded due to plasma damage, are recovered.

Next, a barrier metal portion 67 is formed within these contact holes. The barrier metal portion 67 is formed over the entire exposed surface (and will be patterned at the same time as the process of patterning the wiring layer 70). The barrier metal portion 67 is a titanium nitride (TiN) film having a thickness of approximately 150 nm. The barrier metal portion 67 can for example be formed by a sputtering process, using titanium (Ti) as the target and nitrogen ($N_2$) gas as the process gas. Alternatively, the barrier metal 67 may be a tantalum nitride (TaN) film. In this case, a known sputtering process may be used, with tantalum as the target and using an argon/nitrogen gas mixture. If platinum is used as the material of the upper electrodes 46 and an aluminum alloy is used as the material of the wiring layer 70, a tantalum nitride film can more effectively prevent the phenomenon of reactions between these two materials during the subsequent heat treatment process, as compared with a titanium nitride film.

Next, the contact holes coated with the barrier metal 67 are filled up, and a wiring layer 70 is formed over the barrier metal 67.

Specifically, the aluminum alloy or similar is used to form a conducting film (equivalent to the wiring layer 70; not shown) by normal methods on the barrier metal 67. Next, a reflection prevention film 71, which is for example a titanium nitride film, is deposited on this conducting film.

Deposition of the conductive film which is to become the wiring layer 70 may be performed by a sputtering process, employing an aluminum alloy as the target and argon gas as the process gas.

Similar to the barrier metal 67, the reflection protection film 71 may be formed by a sputtering process using for example titanium (Ti) as the target and nitrogen ($N_2$) as the process gas.

Next, as shown in FIG. 4C, the reflection prevention film, conductive film and barrier metal 67 are patterned using photolithography and etching processes, to form the wiring layer 70.

As described above, the wiring layer 70 has a first wiring portion 72 and a second wiring portion 74.

The first wiring portion 72 is formed on the surface 50a of the fifth insulating film 50 and extends over first partial surface regions 50ab within the memory cell array region 1. The first wiring portion 72 is electrically connected to the plugs 63 or ferroelectric capacitor structures 40 in the memory cell array region.

The second wiring portion 74 is formed on the surface 50a of the fifth insulating film 50, and extends over second partial surface regions 50aa within the logic circuit region 2. The second wiring portions 74 are electrically connected to the plugs 63 in the logic circuit region 2. The first and second wiring portions 72 and 74 are formed simultaneously in the same plane on the fifth insulating film 50, that is, on the surface 50a, but are not electrically connected to each other within the wiring layer 70.

Because this process of formation of the wiring layer 70 may also cause degradation of the electrical characteristics of the ferroelectric layer 44, heat treatment is subsequently performed in an oxygen environment at about 400° C. for about 30 minutes.

Next, as shown in FIG. 5A, a barrier film 90, which is a thin film of aluminum oxide having a thickness of 5 nm to 50 nm, is deposited by the atomic layer deposition method. The barrier film 90 is formed over the entire surface of the semiconductor wafer 11 so that the barrier film 90 extends over the memory cell array region 1 and the logic circuit region 2, thereby covering the wiring layer 70.

Here, the atomic layer deposition method is described in detail.

In order to form the aluminum oxide film (i.e., the barrier film) 90, an atomic layer deposition method employing ozone ($O_3$) is adopted, in order to prevent degradation by hydrogen or water of the ferroelectric layer 44 during the process.

The atomic layer deposition method is a method of adding one atomic layer at a time until the desired film thickness is reached. Hence the process of formation of the barrier film 90 by the atomic layer deposition method is a process of repeating, a plurality of times, a single atomic layer deposition step until the desired film thickness is attained. The single atomic layer deposition step includes a plurality of substeps.

More specifically, while evacuating a vacuum chamber to approximately 0.133 Pa (Pascals) ($1\times10^{-3}$ Torr) with the substrate temperature being 200° C. to 400° C., this deposition step includes four substeps (1) to (4). The first substep (1) introduces triethyl aluminum gas into the chamber, with the nitrogen carrier gas flow rate being 100 to 700 sccm and the introduction time being 50 to 500 ms (milliseconds). The temperature of the tank filled with triethyl aluminum gas is set to 30° C. The second substep (2) introduces nitrogen gas into the chamber at a flow rate of 200 to 1400 sccm. The third substep (3) introduces ozone gas into the chamber, with the nitrogen carrier flow rate being 100 to 700 sccm and the introduction time being between 50 and 500 ms. The ozone concentration relative to the oxygen concentration is 10% to 25%. The fourth substep (4) introduces nitrogen gas into the chamber at a flow rate of 200 to 1400 sccm.

Considered from the standpoint of improving film quality, it is thought that a better-quality aluminum oxide film can be obtained if the temperature of the semiconductor substrate during the film deposition process, that is, the temperature of the semiconductor substrate during manufacturing up to the end of the process to form the wiring layer 70, can be raised to approximately 350° C., for example.

In this deposition step, the introduction of triethyl aluminum gas and ozone gas is carried out such that triethyl aluminum and ozone adhesion to the wiring layer 70 and exposed surface of the fifth insulating film 50 on which the aluminum oxide film is to be formed is sufficiently saturated.

In order to obtain the desired thickness for the barrier film 90, this step is repeated a plurality of times, to stack a plurality of single atomic layers.

It should be noted that when fabricating the ferroelectric memory device of the second embodiment (FIG. 3), a similar step is repeated a plurality of times to deposit the film to fill up the trench portion 52 so as to form the buried portion 92.

Although a detailed explanation is omitted as not pertaining to the gist of this invention, the wiring layer 70 is used as a first wiring layer, and via-holes are provided penetrating the barrier film 90 on the wiring layer 70. Then, second and third wiring layers are formed which are electrically connected to this wiring layer 70, to form a multilayer wiring structure.

Subsequently, as shown in FIG. 5B, a dicing machine is used to perform dicing along the scribe lines L1 to obtain individual devices or chips.

In this way, a plurality of ferroelectric memory devices 100 each having the same structure can be fabricated from a single wafer 11. Each ferroelectric memory device 100 has the form of a so-called (semiconductor) chip.

EXAMPLE

Actual conditions for deposition of the aluminum oxide film by the ALD method described using FIG. 2 are described below.

First the temperature of the semiconductor substrate was set to 300° C., and the chamber was evacuated. (1) The nitrogen-carrier gas flow rate was set to 250 sccm, the triethyl aluminum gas was introduced into the chamber, and the introduction time was set to 125 ms. The temperature of the tank filled with triethyl aluminum gas was set to 30° C. (2) The flow rate was set to 1200 sccm. Nitrogen gas was introduced into the chamber and the introduction time was 125 ms. (3) The nitrogen carrier gas flow rate was set to 600 sccm, ozone gas was introduced into the chamber, and the introduction time was 250 ms. The ozone gas concentration relative to the oxygen concentration was 20%. (4) Nitrogen gas was introduced into the chamber. The flow rate was set to 1200 sccm.

The step having the substeps (1) through (4) was repeated until a film thickness of 50 nm was reached, and the aluminum oxide film of thickness 50 nm described using FIG. 2 was obtained.

Evaluation of the Suppression of Hydrogen and Water Diffusion:

Here, the suppressing of hydrogen and water diffusion of the aluminum oxide film obtained by the same deposition process as in the above-described actual example is described with reference to FIG. 6A and FIG. 6B.

Figure 6A:
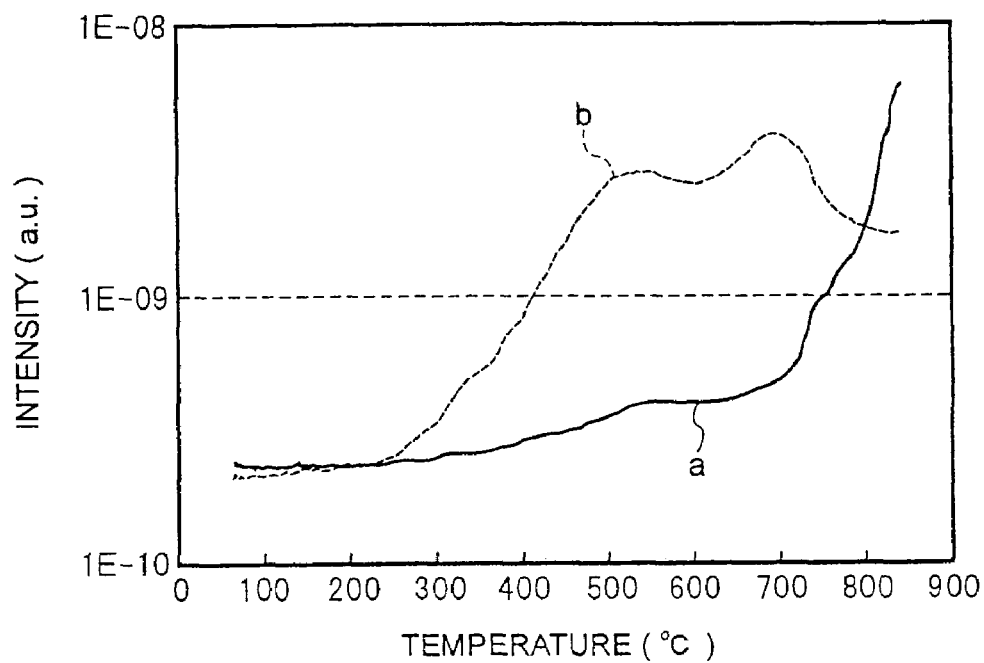
FIG. 6A is a graph evaluating the hydrogen diffusion suppression effect of an aluminum oxide film.
Figure 6B:
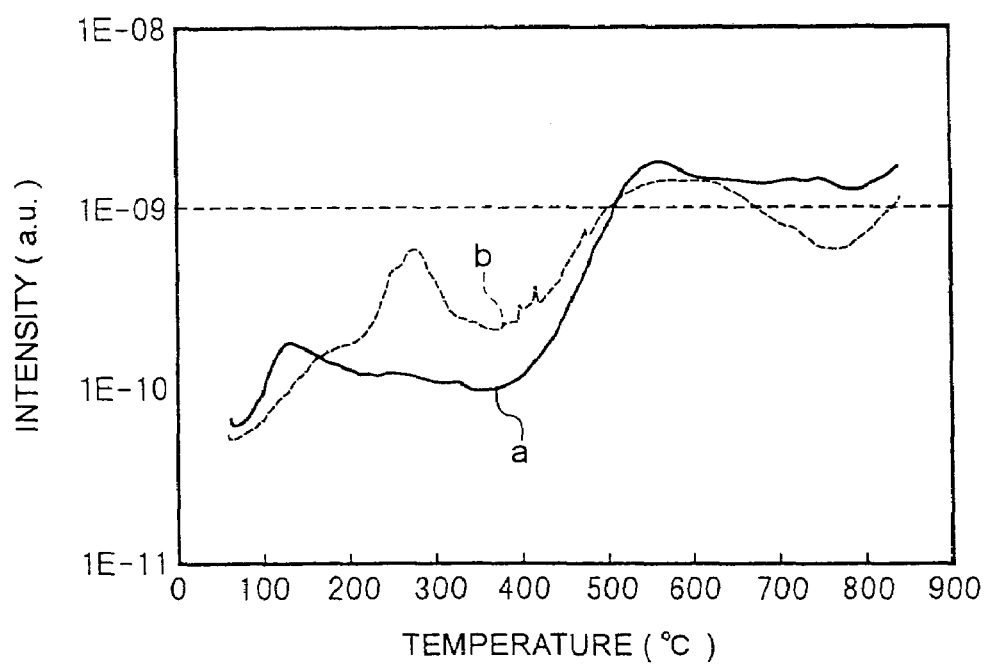
FIG. 6B is a graph evaluating the water diffusion suppression effect of the aluminum oxide film.

FIG. 6A and FIG. 6B are graphs showing the results of evaluations, by the thermal desorption spectrometry (TDS) method, of the prevention of diffusion of hydrogen (FIG. 6A) and water (FIG. 6B) of an aluminum oxide film deposited by the ALD method.

As an evaluation sample, a structure (not shown) was used in which a silicon oxide film was deposited on a silicon substrate to a thickness of 600 nm using TEOS material, and a 50 nm aluminum oxide film was deposited on the silicon oxide film. For comparison, a structure not having an aluminum oxide film on the silicon oxide film (not shown) was used.

The solid line curve a represents analysis results for the structure in which an aluminum oxide film is deposited. The broken line curve b represents analysis results for the structure having no aluminum oxide film.

The horizontal axis of the graph indicates the temperature (° C.) and the vertical axis' indicates the intensity, in arbitrary logarithmic units (a, u).

As is clear from FIG. 6A, when there is no aluminum oxide film (curve b), the intensity increases from a temperature of approximately 250° C.; that is, emission of hydrogen from the silicon oxide film is detected. On the other hand, when there is an aluminum oxide film (curve a), hydrogen emission is suppressed up to approximately 700° C.

As is clear from FIG. 6B, up to approximately 500° C. the emission of water from the silicon oxide film is suppressed more effectively when there is an aluminum oxide film (curve a) than when there is no aluminum oxide film (curve b).

Figure 7A:
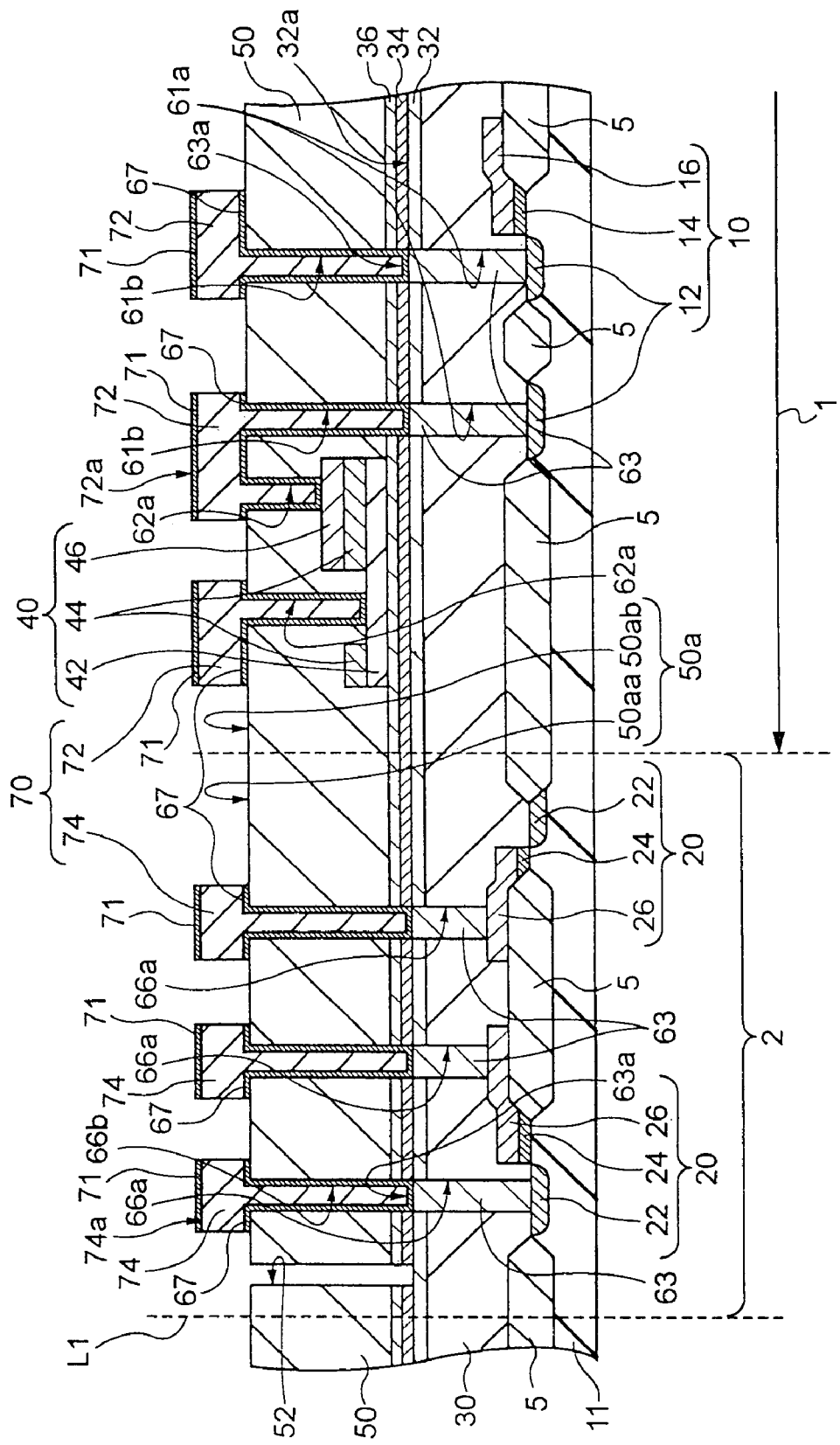
FIG. 7A is a cross-sectional view of a ferroelectric memory device during manufacturing at a wafer level according to the second embodiment, taken along the broken line 7A-7A in FIG. 3A; and, FIG. 7B is a cross-sectional view of the ferroelectric memory device at the wafer level after FIG. 7A, taken along the broken line 7B-7B in FIG. 3A.

In the process of fabrication of a ferroelectric memory of this invention, it is anticipated that there is substantially no heat treatment to be performed exceeding 400° C. after the end of the process to form the barrier film (aluminum oxide film). Hence even a 50 nm thick barrier film with good quality formed by the ALD method can be regarded as being effective in adequately preventing diffusion of hydrogen and water. Method of Manufacture of a Ferroelectric Memory Device of the Second Embodiment:

Next, a method of manufacturing a ferroelectric memory device 100 of the second embodiment is described, referring to FIG. 7A and FIG. 7B.

The manufacturing method of the second embodiment is characterized solely by the process of formation of a trench portion 52, described previously using FIG. 3, and a process of formation of a filler portion 92 which fills up the trench portion 52 (process of deposition of the barrier film 90). Hence a detailed explanation of processes similar to those of the first embodiment is omitted.

FIG. 7A and FIG. 7B are diagrams of manufacturing processes, showing a cross-sectional view taken along the broken lines 7A-7A and 7B-7B in FIG. 3A of a ferroelectric memory device during manufacturing at the wafer level.

Processes are similarly performed up to the process of formation of the wiring layer 70, as described using FIG. 4A, FIG. 4B and FIG. 4C.

Then, the trench portion 52 in a closed square shape is formed in the fifth insulating film 50, as shown in FIG. 7A.

The trench portion 52 encloses the chip region demarcated by the scribe lines L1, i.e., encloses the chip region along and inside the scribe lines L1.

Photolithography and etching processes are used to form the trench portion 52.

After formation of the trench portion 52, heat treatment is performed at 400° C. for 30 minutes in an oxygen environment, in order to recover from degradation of the electrical characteristics of the ferroelectric layer 44.

Next, the ALD method is used to deposit the barrier film 90, as shown in FIG. 7B. By means of this process, the filler portion 92 for the trench portion 52 is formed. Specifically, the trench portion 52 is filled with a portion of the barrier film 90.

According to the method of manufacturing the ferroelectric memory device 100, the ALD method is used in the barrier film formation process, so that the wiring layer can be covered directly by the barrier film while preventing so-called charge-up. Hence a process to form a liner oxide film, which had been regarded as essential for preventing destruction of gate insulating film is no longer needed, and an annealing process under conditions conventionally regarded as necessary is no longer needed. Consequently a ferroelectric memory device 100 free of degradation of the initial characteristics of the ferroelectric memory cell array which would be otherwise caused by formation of a liner oxide film can be provided by means of more simple processes.

Further, the barrier film formed by the ALD method has a higher density and better step coverage than a film formed by a conventional method such as sputtering, so that the film thickness can be reduced. As a result, the device electrical characteristics can be made better even when forming a wiring structure with a greater number of layers.

Moreover, there is no longer a need to consider the antenna ratio, so that there is a greater degree of freedom in wiring layout design. That is, the wiring design can be optimized, so that a ferroelectric memory device can be provided with improved wiring electrical characteristics.

As a result, production yields for manufactured ferroelectric memory devices can be improved.

This application is based on a Japanese Patent Application No. 2005-114680 filed on Apr. 12, 2005 and the entire disclosure thereof is incorporated herein by reference.

What is claimed is:

1. A ferroelectric memory device, comprising:
a semiconductor substrate, on which are provided a plurality of elements, each said element including a memory cell element and a plurality of logic circuit elements;
a lower insulating film provided on said semiconductor substrate;
a ferroelectric capacitor structure provided on said lower insulating film, and being formed by layering, in order, a lower electrode, a ferroelectric layer, and an upper electrode;
an upper insulating film, which covers said lower insulating film and said ferroelectric capacitor structure;
a wiring layer, which extends over said upper insulating film, and is electrically connected to said ferroelectric capacitor structure, said memory cell element, and said logic circuit elements; and,
a barrier film which directly and without interruption covers a side face and an upper face of said wiring layer, and directly and without interruption covers an upper face of said upper insulating film.

2. The ferroelectric memory device according to claim 1, wherein said barrier film is an aluminum oxide film having a thickness of 5 to 50 nm.

3. The ferroelectric memory device according to claim 2, wherein said aluminum oxide film is formed by an atomic layer deposition method.

4. A ferroelectric memory device comprising:
a semiconductor substrate, on which are provided a plurality of elements, each including a memory cell element and a plurality of logic circuit elements;
a lower insulating film provided on said semiconductor substrate;
a lower hydrogen barrier film provided on said lower insulating film;
a ferroelectric capacitor structure provided on said lower hydrogen barrier film and formed by layering, in order, a lower electrode, a ferroelectric layer, and an upper electrode;
an upper insulating film which covers said ferroelectric capacitor structure;
a wiring layer which extends over said upper insulating film, and is electrically connected to said ferroelectric capacitor structure, said memory cell element, and said logic circuit elements; and,
an upper hydrogen barrier film which directly and without interruption covers a side face and an upper face of said wiring layer, and directly and without interruption covers an upper face of said upper insulating film.

5. The ferroelectric memory device according to claim 4, wherein said upper and lower hydrogen barrier films are aluminum oxide films having a thickness 5 to 50 nm and formed by an atomic layer deposition method.

6. A ferroelectric memory device comprising:
a semiconductor substrate, including a memory cell array region in which are provided a plurality of memory cell elements and a logic circuit region in which are provided a plurality of logic circuit elements;
a lower insulating film, provided in said memory cell array region and in said logic circuit region on said semiconductor substrate;
a lower hydrogen barrier film provided on said lower insulating film;
a ferroelectric capacitor structure, provided within said memory cell array region on said lower hydrogen barrier film, and formed by layering, in order, a lower electrode, a ferroelectric layer, and an upper electrode;
an upper insulating film which covers said lower insulating film and said ferroelectric capacitor structure, and is provided in said memory cell array region and in said logic circuit region, said upper insulating film having a trench portion extending inside and along scribe lines;
a wiring layer which extends over said upper insulating film, and fills up contact holes extending from a surface of said upper insulating film to said ferroelectric capacitor structure; and,
an upper hydrogen barrier film which covers said wiring layer and said upper insulating film, said upper hydrogen barrier film filling up said trench portion.

7. The ferroelectric memory device according to claim 6, wherein said upper hydrogen barrier film and said lower hydrogen barrier film are aluminum oxide films having a thickness of 5 to 50 nm and formed by an atomic layer deposition method.

8. The ferroelectric memory device according to claim 6 further comprising a metal film which coats each said contact hole.

* * * * *